(12) United States Patent
Yamazoe

(10) Patent No.: US 6,968,529 B2
(45) Date of Patent: Nov. 22, 2005

(54) PHASE SHIFT MASK, AND EXPOSURE METHOD AND DEVICE MANUFACTURING METHOD USING THE SAME

(75) Inventor: Kenji Yamazoe, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 322 days.

(21) Appl. No.: 10/600,490

(22) Filed: Jun. 20, 2003

(65) Prior Publication Data
US 2004/0053144 A1 Mar. 18, 2004

(30) Foreign Application Priority Data
Jun. 21, 2002 (JP) .............................. 2002-180948

(51) Int. Cl.[7] .......................... G06F 17/50; G03F 1/00
(52) U.S. Cl. .......................... 716/19; 716/20; 716/31; 430/5
(58) Field of Search ..................... 716/19–21; 430/5, 430/311–322

(56) References Cited

U.S. PATENT DOCUMENTS

| | | | | |
|---|---|---|---|---|
| 5,318,868 A | * | 6/1994 | Hasegawa et al. .............. | 430/5 |
| 5,536,604 A | * | 7/1996 | Ito ................................ | 430/5 |
| 5,631,109 A | * | 5/1997 | Ito ................................ | 430/5 |
| 5,700,605 A | * | 12/1997 | Ito et al. ......................... | 430/5 |
| 5,958,630 A | * | 9/1999 | Hashimoto et al. ............. | 430/5 |
| 6,274,281 B1 | * | 8/2001 | Chen .............................. | 430/5 |
| 6,511,778 B2 | * | 1/2003 | Okazaki et al. ................. | 430/5 |
| 6,902,851 B1 | * | 6/2005 | Babcock et al. ................ | 430/5 |
| 2002/0015900 A1 | * | 2/2002 | Petersen ......................... | 430/5 |
| 2002/0086222 A1 | * | 7/2002 | Migitaka et al. ............... | 430/5 |
| 2004/0023129 A1 | * | 2/2004 | Kokubo .......................... | 430/5 |

FOREIGN PATENT DOCUMENTS

JP 11-119411 4/1999

OTHER PUBLICATIONS

"SCAA Mask Exposures and Phase Phirst Design for 110nm and Below" M.D. Levenson et al., Proceedings of SPIE, 4346, (2001), pp. 817-826.

* cited by examiner

Primary Examiner—Stacy A. Whitmore
Assistant Examiner—Magid Y. Dimyan
(74) Attorney, Agent, or Firm—Morgan & Finnegan, LLP

(57) ABSTRACT

Disclosed is a phase shift mask capable of assuring high-precision pattern transfer, an exposure method and apparatus using such phase shift mask, and a device manufacturing method using such phase shift mask. The phase shift mask includes a substrate having an engraved portion and a non-engraved portion, the engraved portion having a side wall and a bottom face, and a light blocking film provided in a portion of the bottom face and the side wall of the engraved portion. Specifically, the size to be defined by subtracting a thickness of the light blocking film at the side wall from a width of the engraved portion is made equal to 1.3 to 2.4 times the width of a light transmitting portion provided at the engraved portion.

9 Claims, 8 Drawing Sheets

PHASE SHIFT MASK, AND EXPOSURE METHOD AND DEVICE MANUFACTURING METHOD USING THE SAME

FIELD OF THE INVENTION AND RELATED ART

This invention relates generally to a mask or reticle and, more particularly, a shape shift mask, an exposure method using such phase shift mask and a device manufacturing method using such phase shift mask.

Fine patterns of a device such as a large scaled semiconductor integrated circuit are formed mainly by use of a reduction projection exposure method using an exposure apparatus. FIG. 7 is a schematic view, showing a general structure of an exposure apparatus. In FIG. 7, denoted at 11 is a mask (reticle) as an original, having a predetermined pattern including light blocking portions and light transmitting portions. This mask is illuminated by an illumination system 14, with use of light from a light source (not shown). Diffraction light passed through the light transmitting portions of the mask is then projected by a projection optical system 12, onto a wafer (substrate) as a workpiece, whereby the predetermined pattern of the mask is exposed (photoprinted) on the workpiece.

As one method of remarkably improving the resolving power when the above-described exposure method is used, there is a method (hereinafter, "phase shift method") in which a phase difference is applied to between exposure lights passed through adjacent light transmitting portions of the mask. In accordance with this method, where the mask pattern comprises a repetition pattern (called a line-and-space pattern) consisting of linear and thin light transmitting portions and light blocking portions, transparent materials (phase shifter) for applying a phase difference are provided alternately on the light transmitting portions, so that the lights passed through adjacent light transmitting portions on the mask bear a mutual phase difference of approximately 180 deg. or a product of it by an odd number. Since, in this method, generally the phase difference between lights passed through adjacent light transmitting portions on a mask is approximately 180 deg., the following description will be made on a case where the phase difference of lights passed through adjacent light transmitting portions of the mask is approximately 180 deg.

A mask (hereinafter, "phase shift mask") to be used in such phase shift method can be produced by providing phase shifters, as described above, upon predetermined light transmitting regions of a binary mask as has been used conventionally (for example, "IEEE Trans. Electron Devices", Ed.29, No.12 (1982), pp1828–1836).

Another method known in the art is that the phase shifter means is provided by engraving a mask substrate itself by etching or the like. However, in relation to phase shift masks of the type having phase shifter means (engraved portions) formed by etching the mask substrate itself, it is known that, where the mask substrate has been etched so that the size "a" of a light transmitting portion without having a phase shift pattern and the size "b" of a light transmitting portion having a phase shift pattern becomes equal to each other, as schematically illustrated in FIG. 1A, there occurs a phenomenon that, in the intensity distribution of light projected on a wafer, the peal value $I_1$ of the light intensity on the wafer corresponding to the mask pattern having a phase shift pattern becomes lower than the peak value $I_2$ of the light intensity on the wafer corresponding to the mask pattern having no phase shift mask, as shown in FIG. 3A.

If the pattern is transferred to the wafer in such state, the size $d_1$ of a pattern photoprinted on the wafer by use of the mask pattern having a phase shift pattern would become smaller than the size $d_2$ of a pattern photoprinted on the wafer by use of the mask pattern having no phase shift pattern. Namely, a desired pattern cannot be printed on the wafer.

As the factors that may cause $I_1$ lower than $I_2$, there may be waveguide effect and effect of leakage of exposure light from a side wall of the engraved portion of the mask substrate. As regards the latter, since the phase difference between the leaked light and exposure light passed through the light transmitting portion having no phase shift pattern is not kept at 180 deg., such a decrease of light intensity occurs.

In order to meet this problem, a light blocking film may be provided at a side wall portion and a bottom portion of an engraved portion of the mask substrate to avoid leakage of exposure light from the side wall of the engraved portion of the mask substrate. This may reduce, to some degree, the phenomenon that the peak value $I_1$ of the light intensity on the wafer corresponding to the mask pattern having a phase shift pattern becomes lower than the peak value $I_2$ of the light intensity on the wafer corresponding to the mask pattern having no phase shift pattern.

In Japanese Laid-Open Patent Application No. 11-119411, a light blocking film is provided at a side wall of an engraved portion of a substrate (see FIG. 2B). However, as schematically shown in FIG. 2B, the size of the light transmitting portion at the engraved portion and the size defined by subtracting the light blocking film thickness at the side wall from the width of the engraved portion of the substrate, are both equal to "b" and equal to each other. In such occasion, as can be seen also from FIG. 5 to be described later, rather, in the case where no light blocking film is provided as the side wall of engraved portion, as compared with the case where a light blocking film is provided there, the peak value $I_1$ of the light intensity on the wafer corresponding to the mask pattern having a phase shift mask would become much smaller than the peak value $I_2$ of the light intensity on the wafer corresponding to the mask pattern having no phase shift mask.

Here, FIG. 2B is a schematic view, showing a mask having been so designed that the width of the light transmitting portion at the engraved portion does not become substantially equal to the size defined by subtracting the light blocking film thickness at the side wall portion from the width of the engraved portion of the substrate. FIG. 3B illustrates a light intensity distribution to be produced on a wafer when this mask pattern is illuminated. As seen from FIG. 3B, even with the mask of FIG. 2B, the difference between the peak value $I_1$ of the light intensity on the wafer corresponding to the mask pattern having a phase shift mask and the peak value $I_2$ of the light intensity on the wafer corresponding to the mask pattern having no phase shift mask is reduced only by little. Therefore, if the pattern is transferred onto the wafer on the basis of such optical image, the size $d_1'$ on the wafer corresponding to the mask pattern having a phase shift mask becomes smaller than the size $d_2'$ on the wafer corresponding to the mask pattern having no phase shift mask. This may result from that the relationship between the width of the light transmitting portion at the engraved portion and the size defined by subtracting the light blocking film thickness at the side wall portion from the width of the engraved portion of the substrate, is inappropriate.

As discussed above, the pattern transfer precision of a phase shift mask varies with the relationship between the width of the light transmitting portion at the engraved portion and the size defined by subtracting the light blocking film thickness at the side wall portion from the width of the engraved portion of the substrate. Conventionally, however, it was unknown how to set this relationship.

As is known in the art, the peak value $I_1$ of the light intensity on the wafer corresponding to the mask pattern having a phase shift mask and the peak value $I_2$ of the light intensity on the wafer corresponding to the mask pattern having no phase shift mask, can be made approximately equal to each other, by forming the light blocking film for the pattern a phase shift pattern, in an overhang shape such as schematically shown in FIG. 1B. In such method, however, due to the mechanical intensity at the overhang portion of the light blocking film, mask pattern faults easily occur during the mask production process. If any foreign particle enters a concave-shaped portion of the phase shift pattern, it is very hard to remove such particle. This method is therefore not an essential solution.

SUMMARY OF THE INVENTION

It is accordingly an object of the present invention to provide a unique and useful phase shift mask which can solve at least one of the problems described above.

It is another object of the present invention to provide an exposure method using such phase shift mask, and/or a device manufacturing method using such phase shift mask.

In accordance with an aspect of the present invention, there is provided a phase shift mask, comprising: a substrate having an engraved portion and a non-engraved portion, said engraved portion having a side wall and a bottom face; and a light blocking film provided in a portion of the bottom face and the side wall of said engraved portion, wherein the size to be defined by subtracting a thickness of the light blocking film at the side wall from a width of said engraved portion is equal to 1.3 to 2.4 times the width of a light transmitting portion provided at said engraved portion.

In accordance with another aspect of the present invention, there is provided an exposure method, comprising the steps of: preparing a phase shift mask; illuminating the phase shift mask; and projecting a pattern of the phase shift mask onto a substrate, wherein the phase shift mask includes (i) a substrate having an engraved portion and a non-engraved portion, the engraved portion having a side wall and a bottom face, and (ii) a light blocking film provided in a portion of the bottom face and the side wall of the engraved portion, wherein the size to be defined by subtracting a thickness of the light blocking film at the side wall from a width of the engraved portion is equal to 1.3 to 2.4 times the width of a light transmitting portion provided at the engraved portion.

In accordance with a further aspect of the present invention, there is provided a device manufacturing method, comprising the steps of: preparing a phase shift mask; illuminating the phase shift mask; projecting a pattern of the phase shift mask onto a substrate; and developing the substrate, wherein the phase shift mask includes (i) a substrate having an engraved portion and a non-engraved portion, the engraved portion having a side wall and a bottom face, and (ii) a light blocking film provided in a portion of the bottom face and the side wall of the engraved portion, wherein the size to be defined by subtracting a thickness of the light blocking film at the side wall from a width of the engraved portion is equal to 1.3 to 2.4 times the width of a light transmitting portion provided at the engraved portion.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

An embodiment of the present invention uses an exposure apparatus having a KrF excimer laser (exposure wavelength $\lambda=248$ nm) as a light source and a numerical aperture NA=0.6 and a reduction ratio 4:1.

As described in the introductory part of this specification, the phase shift method is a method in which a phase difference of about 180 deg. is applied to between exposure lights passing through adjacent light transmitting regions upon a mask, thereby to improve the resolution.

The etching depth for introducing 180 deg. which is the best value for the phase difference, is determined in accordance with the following equation.

$$t=\lambda/2(n_1-n_0) \qquad (1)$$

where t is etching depth, $\lambda$ is exposure wavelength, $n_1$ is refractivity of the phase shifter with respect to the exposure wavelength $\lambda$. Where a mask substrate is etched to produce a phase shifter, since a portion of the mask substrate provides the phase shifter, $n_1$ corresponds to the refractivity of the mask substrate. Also, $n_0$ is the refractivity of an exposure ambience (usually, air) with respect to the exposure wavelength $\lambda$, and practically it is 1.

This embodiment concerns a case where synthetic quartz is used as the mask substrate. The synthetic quartz has a refractivity $n_1=1.51$ with respect to the exposure wavelength=248 nm. The synthetic quartz mask substrate was etched to provide phase shifter. According to equation (1), the optimum value of the etching depth t of the mask substrate was 244 nm.

Further, this embodiment concerns a case where chromium is used as a material for the light blocking film. The complex refractivity $n_c$ of chromium is 1.32+2.11i where i is an imaginary unit which becomes equal to −1 if squared.

Where light advances within a tubular member, the manner of advancement of light differs in accordance with the shape of the tubular member, the material that forms the tube, and the polarization of light advancing therein. In a case where, as in this embodiment, a light blocking film is provided at a side wall portion of an engraved portion of synthetic quartz material, the exposure light acts as if it goes through a certain tube. Taking into account this phenomenon, the decrease in light intensity as described hereinbefore can be compensated for.

A specific embodiment of the present invention will now be described.

Figure 1A:
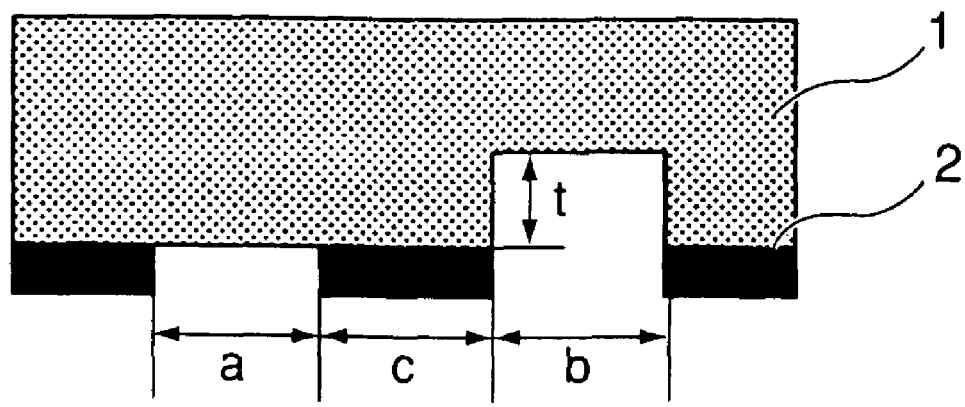
FIGS. 1A and 1B are schematic views, each illustrating the sectional structure of a conventional phase shift mask.
Figure 1B:
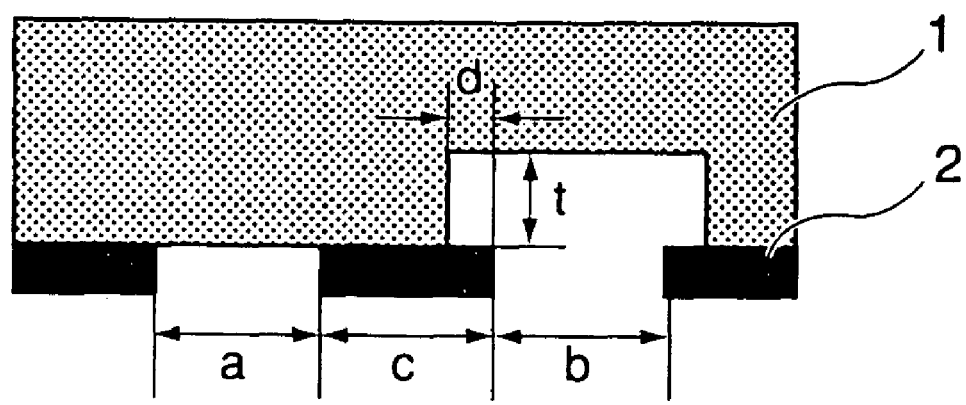
Figure 2A:
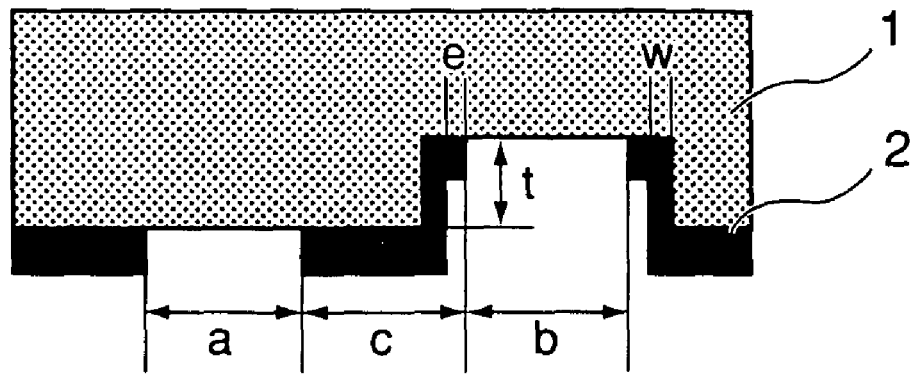
FIGS. 2A and 2B are sectional views, each illustrating the sectional structure of a conventional phase shift mask.
Figure 2B:
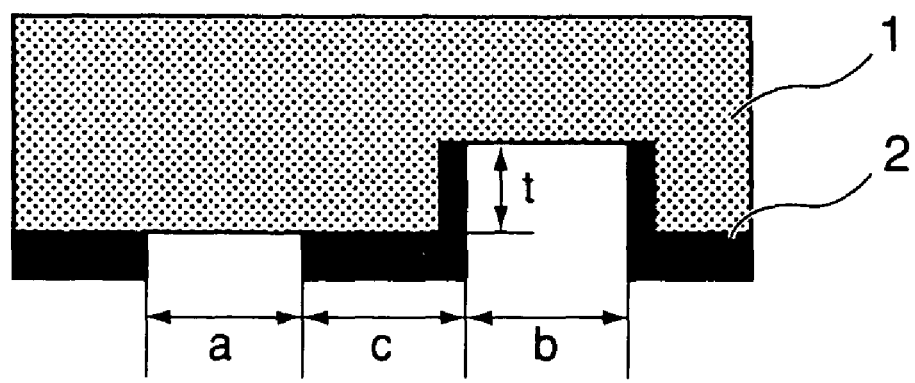
Figure 3A:
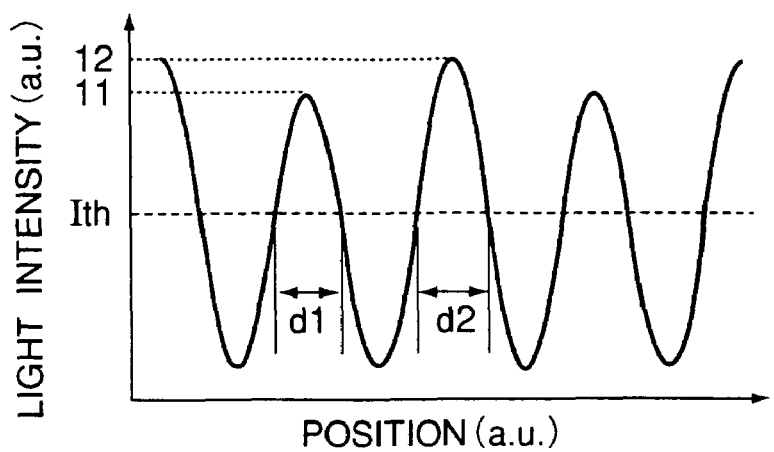
FIGS. 3A–3C are graphs, each showing light intensity distribution on a wafer.
Figure 3B:
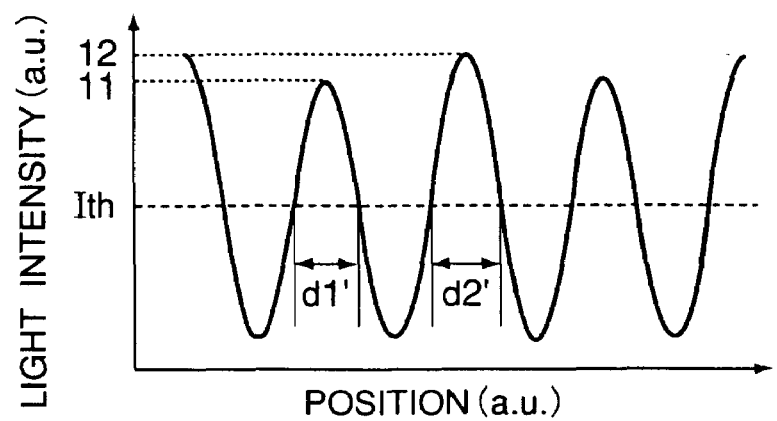
Figure 3C:
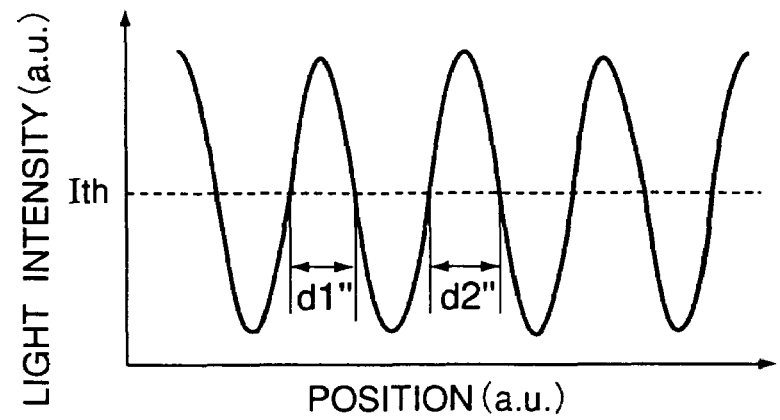
Figure 4A:
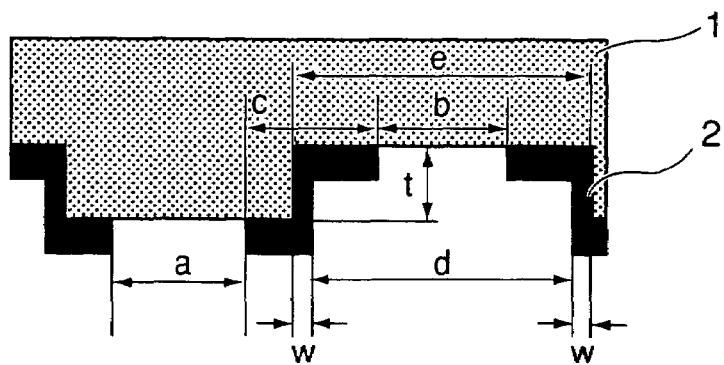
FIGS. 4A and 4B are schematic views, each illustrating the sectional structure of a phase shift mask according to an embodiment of the present invention.

FIG. 4A is a sectional view of a mask according to this embodiment, in which the mask has a line-and-space (L/S) pattern of a ratio 1:1. Here, the size "a" of a light transmitting portion of a mask pattern having no phase shift pattern provided there is 500 nm, and also the size "b" of a light transmitting portion of a mask pattern having a phase shift pattern provided there is 500 nm. Furthermore, the mask pattern size "c" of a light blocking portion is 500 nm.

As regards the shape of the mask, the substrate is provided with an engraved portion of a width "e"=1,250 nm, being engraved to a predetermined depth t as can be defined by equation (1). At the opposite sides of the engraved portion of the substrate, there are light blocking films of a width 375 nm and a thickness 100 nm. The portion of the substrate, not processed by etching, has a width 750 nm. At the opposite sides of this portion, there are light blocking films of a width 125 nm and a thickness 100 nm. The size "d" defined by subtracting the thickness of the light blocking films, provided at the opposite sides of the engraved portion, from the width of the engraved portion (etched portion) is equal to 1,050 nm. Here, taking into account the magnification of the optical system of this embodiment, it is intended to transfer an L/S pattern of 125 nm upon a wafer.

Figure 4B:
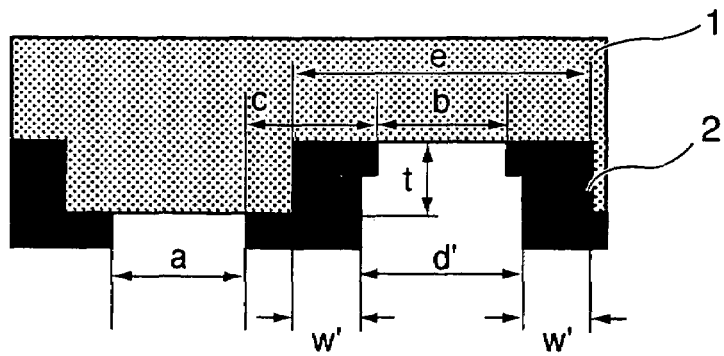
Figure 5:
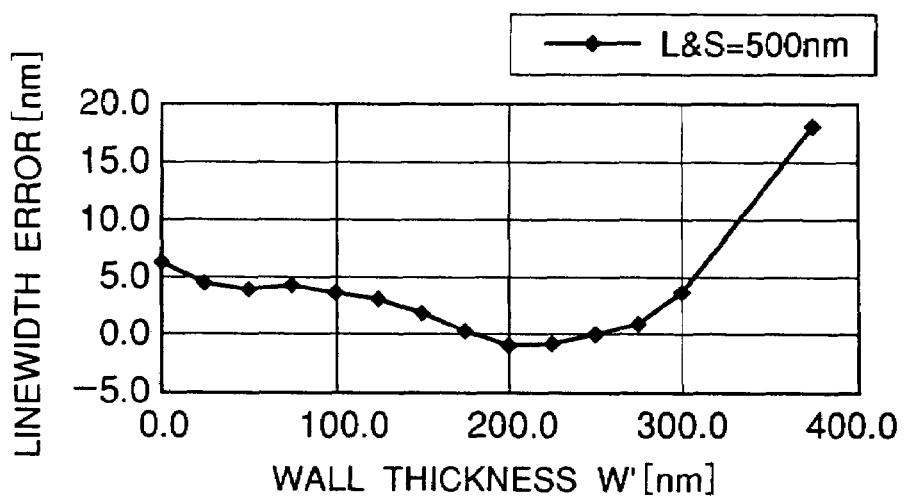
FIG. 5 is a graph for explaining the function of a phase shift mask according to an embodiment of the present invention.
Figure 6A:
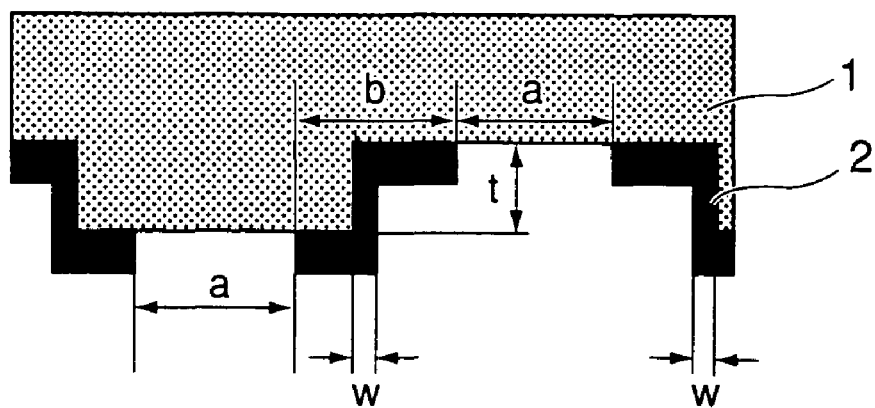
FIGS. 6A–6C are schematic views, each illustrating a sectional structure of a mask according to an embodiment of the present invention.
Figure 6B:
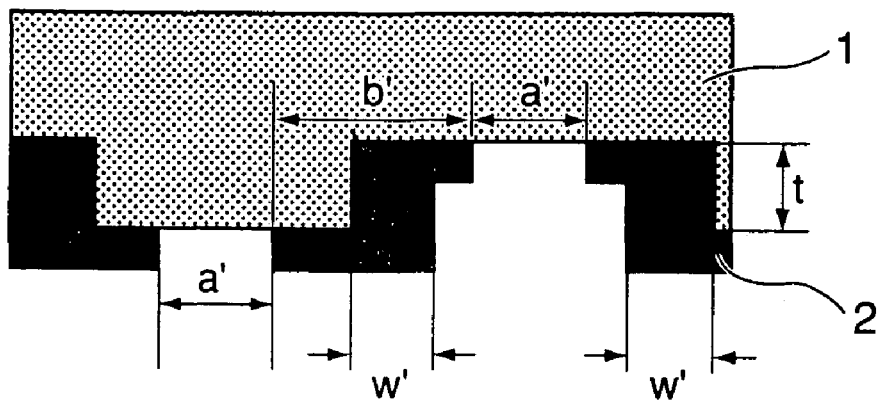
Figure 6C:
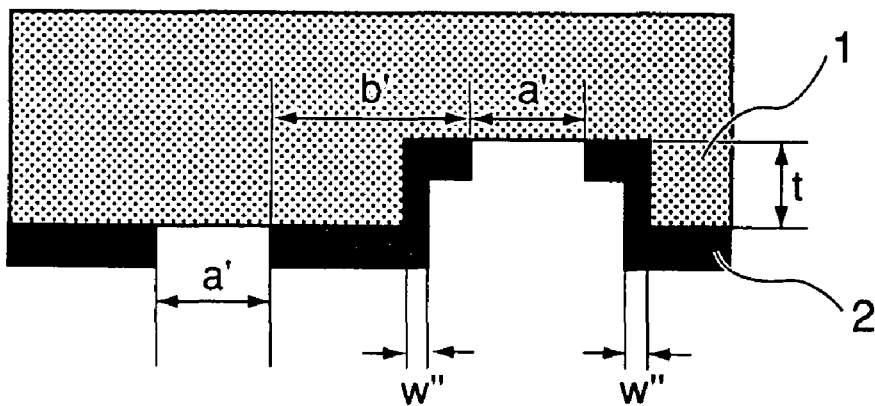

FIG. 4B schematically illustrates that, in the basic structure described above, light blocking films are provided on side walls of engraved portions of synthetic quartz substrate to thereby change the light blocking film thickness w at the side walls. FIG. 5 illustrates the results of investigations made to the difference in pattern linewidth upon the wafer, as can be estimated from a light intensity distribution on the wafer corresponding to a mask pattern having a phase shift mask and a light intensity distribution on the mask corresponding to a mask pattern having no phase shift pattern. The axis of abscissa in FIG. 5 corresponds to the thickness w of the light blocking film provided at the side wall of the substrate engraved portion. The axis of ordinate corresponds to a linewidth error during exposure. Definition is as follows. It is now assumed that, at a certain light intensity level $I_s$ on the wafer, a pattern having been formed on the wafer in accordance with the light blocking portion of the mask pattern is equal to one-fourth of the L/S pattern on the mask (here, 125 nm since the magnification of the optical system is ¼×). Also, it is assumed that the linewidth of a pattern formed on the wafer with this light intensity level $I_s$ and in association with the mask pattern having no phase shift pattern, is $CD_1$. The value as can be given by subtracting one-fourth of the L/S pattern on the mask from the above-described $CD_1$ does correspond to the axis of ordinate in FIG. 5.

Taking into account the periodicity of the mask pattern, if the level at the axis of ordinate in FIG. 5 becomes equal to zero, it means that there is no more difference between the peak value $I_1$ of the light intensity on the wafer corresponding to the mask pattern having a phase shift pattern and the peak value $I_2$ of the light intensity on the wafer corresponding to the mask pattern having no phase shift pattern. From FIG. 5, it is seen that in this embodiment the difference between the light intensity on the wafer corresponding to the mask pattern having a phase shift pattern and the light intensity on the wafer corresponding to the mask pattern having no phase shift pattern, can be substantially avoided where the light blocking film provided at the side wall has a thickness 185 nm or 250 nm. Also, it is seen from FIG. 5 that the linewidth error can be made equal to 5 nm or less (this is 4% or less of 125 nm, and practically it raises no problem), if the thickness of the light blocking film provided at the side wall of the engraved portion is in a range of 25–300 nm. That is, it may be in a range 1/20 times to 3/5 times the size 500 nm of the light transmitting portion of the mask pattern having no phase shift pattern. Here, the size "d" given by subtracting the thickness of the light blocking films provided at the opposite sides of the engraved portion from the width of the engraved portion (etched portion) may well be in a range of 650–1,200 nm, that is, in a range 1.3 times to 2.4 times the size 500 nm of the light transmitting portion of the mask pattern having no phase shift pattern.

If it is desired to reduce the linewidth error much more, the light blocking film thickness may preferably be in a range of 175–275 nm, namely, in a range 7/20 times to 11/20 times the size 500 nm of the light transmitting portion of the mask pattern having no phase shift pattern. Here, the size "d" given by subtracting the thickness of the light blocking films provided at the opposite sides of the engraved portion from the width of the engraved portion may well be in a range of 700–900 nm, that is, in a range 1.4 times to 1.8 times the size 500 nm of the light transmitting portion of the mask pattern having no phase shift pattern.

It has been investigated that there is still an optimum thickness for the light blocking film to be provided at the side wall of the substrate engraved portion, even if the width or ration of L/S pattern is changed.

As regards the width "e" of the engraved portion of the substrate, as in this embodiment, preferably it should be made wide such as being 1.25 times or more the sum of line pattern and space pattern (namely, 2.5 times or more the size of the light transmitting portion of the mask pattern having no phase shift pattern). The light blocking film at the side wall of the engraved portion has a feature that it prevents leakage of light from the side wall and changes the imaging performance. In consideration of it, the width of the engraved portion should be made large in advance, and a thin light blocking film may be provided at the side wall. Exposure evaluation may be carried out with such mask and, if there is a difference in imaging intensity between the engraved portion and the non-engraved portion, the mask may be washed and than the thickness of the light blocking film to be provided at the side wall may be enlarged. By repeating this procedure, a mask as optimized to provide the same imaging intensity for the pattern at the engraved portion and for the pattern at the non-engraved portion can be provided easily, without repeating the etching process.

With use of a phase shift mask such as described hereinbefore, a transfer pattern precision much higher than that as attainable with a conventional phase shift mask, can be achieved. Although a mask having a line-and-space pattern is used in the embodiment described above, the present invention can also be applied to any other periodic pattern (such as a pattern with contact holes, for example), similarly.

Figure 7:
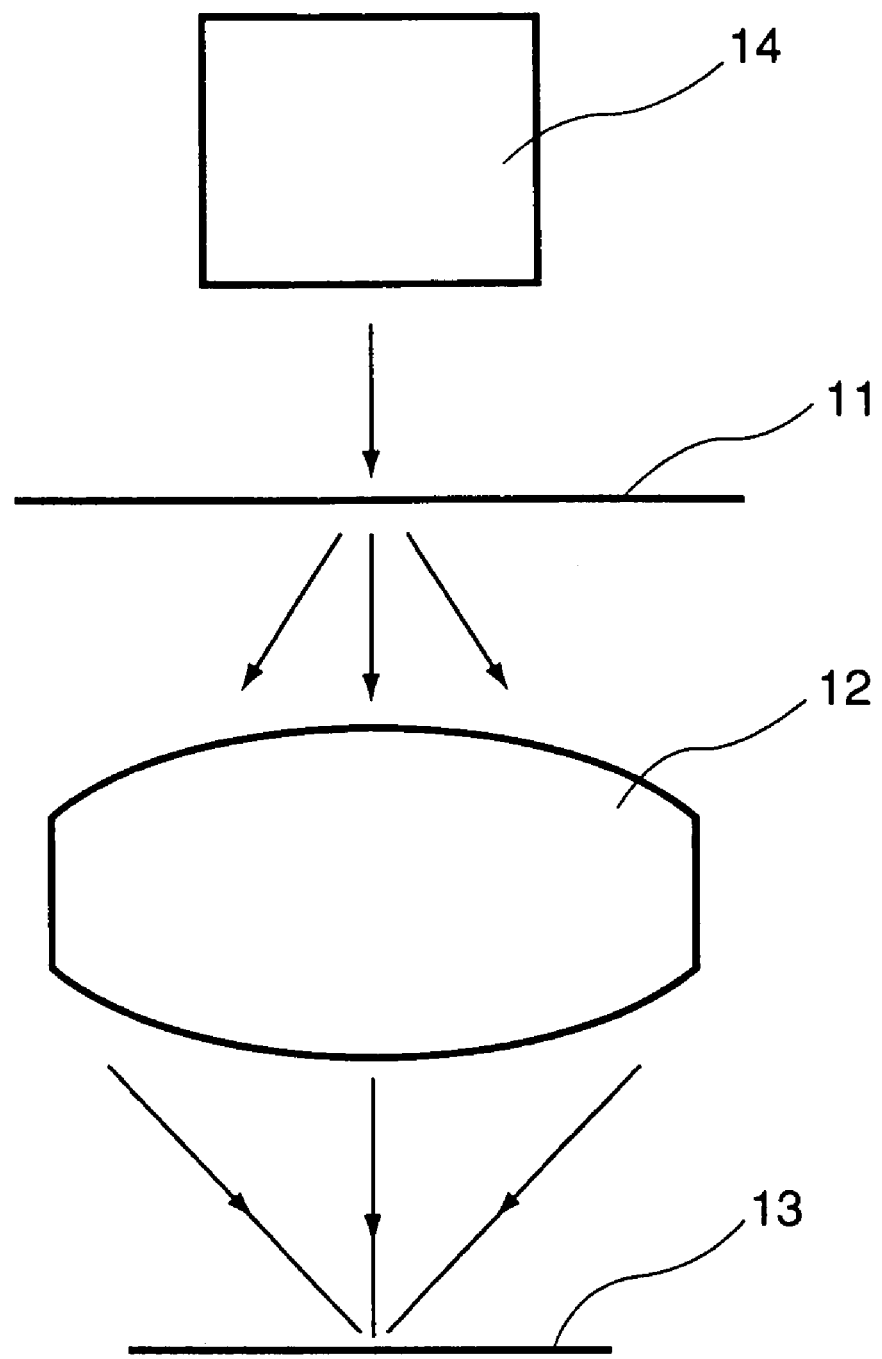
FIG. 7 is a schematic view of an exposure apparatus to which the present invention is applicable.

Next, an embodiment of a device manufacturing method which uses a phase shift mask of the present invention and an exposure apparatus shown in FIG. 7, will be explained.

Figure 8:
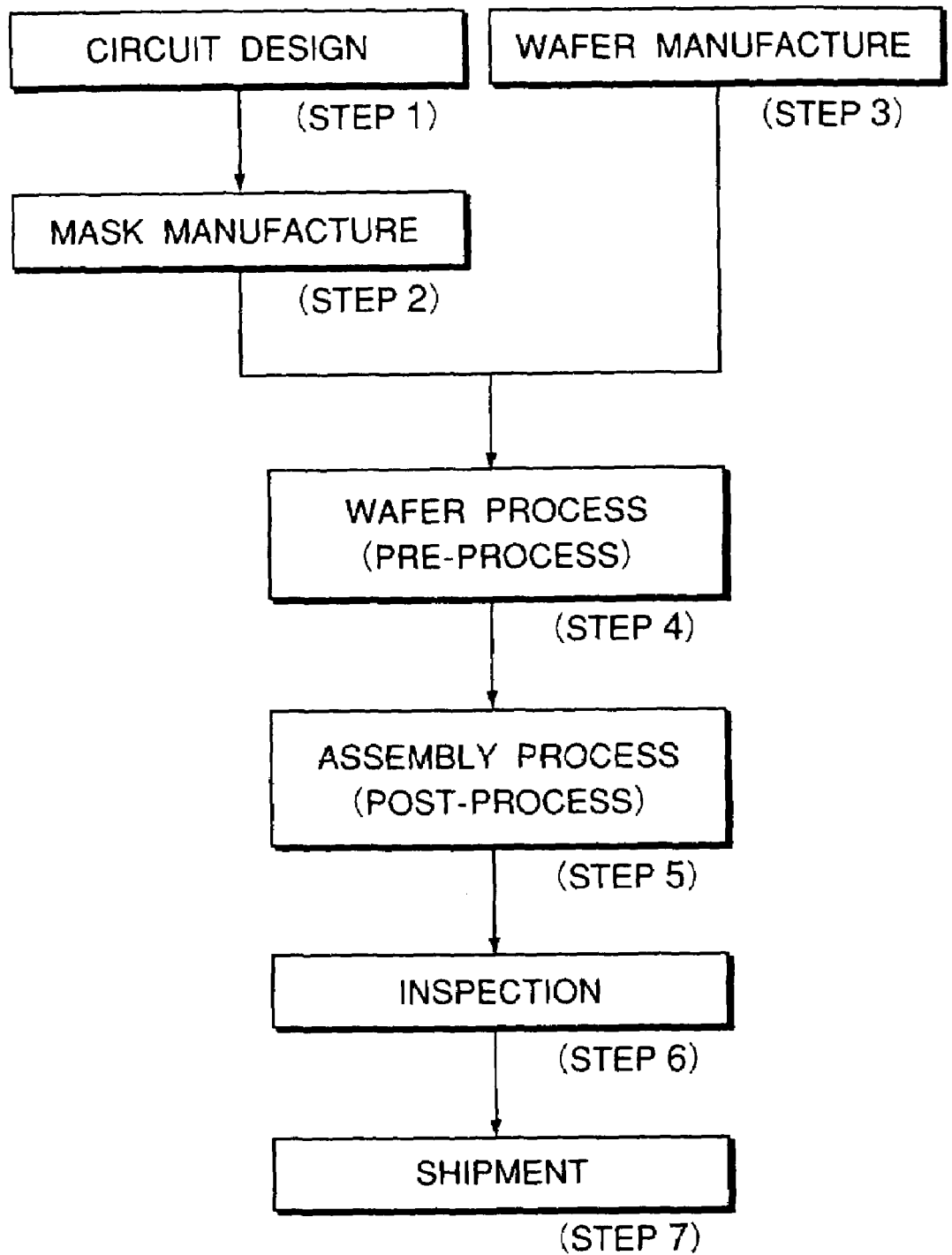
FIG. 8 is a flow chart of device manufacturing processes.

FIG. 8 is a flow chart for explaining the procedure of manufacturing various microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 9:
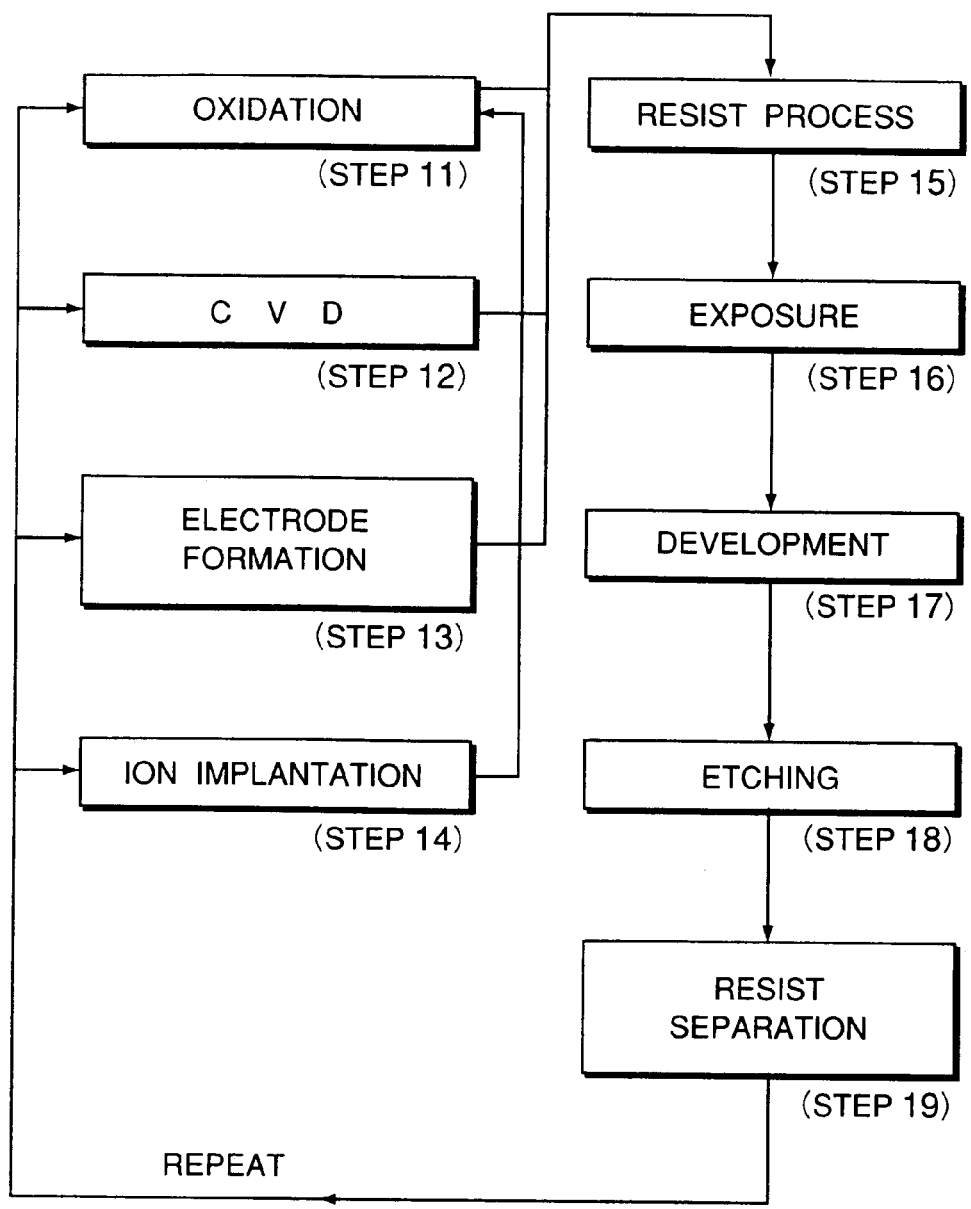
FIG. 9 is a flow chart for explaining details of a wafer process in the procedure of FIG. 8.

FIG. 9 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposurey the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, higher precision microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A phase shift mask, comprising:
   a substrate having an engraved portion and a non-engraved portion, said engraved portion having a side wall and a bottom face; and
   a light blocking film provided in a portion of the bottom face and the side wall of said engraved portion,
   wherein a value to be defined by subtracting a thickness of the light blocking film at the side wall from a width of said engraved portion is equal to 1.3 to 2.4 times a width of a light transmitting portion provided at said engraved portion.

2. A phase shift mask according to claim 1, wherein the value to be defined by subtracting a thickness of the light blocking film at the side wall from a width of said engraved portion is equal to 1.4 to 1.8 times the width of the light transmitting portion provided at said engraved portion.

3. A phase shift mask according to claim 1, wherein the thickness of the light blocking film provided at the side wall of said engraved portion is equal to 0.05 to 0.6 times the width of the light transmitting portion provided at said engraved portion.

4. A phase shift mask according to claim 2, wherein the thickness of the light blocking film provided at the side wall of said engraved portion is equal to 0.35 to 0.55 times the width of the light transmitting portion provided at said engraved portion.

5. A phase shift mask according to claim 1, wherein the width of said engraved portion is equal to at least 2.5 times the width of the light transmitting portion provided at said engraved portion.

6. A phase shift mask according to claim 1, wherein a depth of said engraved portion is determined so that a phase difference, corresponding to a product of 180 degrees by an odd number, is produced between light from the light transmitting portion of said engraved portion and light from said non-engraved portion.

7. A phase shift mask according to claim 1, wherein the light transmitting portion provided at said engraved portion and a light transmitting portion defined at said non-engraved portion have a line-like shape.

8. An exposure method, comprising the steps of:
   preparing a phase shift mask;
   illuminating the phase shift mask; and
   projecting a pattern of the phase shift mask onto a substrate,
   wherein the phase shift mask includes (i) a substrate having an engraved portion and a non-engraved portion, the engraved portion having a side wall and a bottom face, and (ii) a light blocking film provided in a portion of the bottom face and the side wall of the engraved portion, wherein a value to be defined by subtracting a thickness of the light blocking film at the side wall from a width of the engraved portion is equal to 1.3 to 2.4 times the width of a light transmitting portion provided at the engraved portion.

9. A device manufacturing method, comprising the steps of:
   preparing a phase shift mask;
   illuminating the phase shift mask;
   projecting a pattern of the phase shift mask onto a substrate; and
   developing the substrate,
   wherein the phase shift mask includes (i) a substrate having an engraved portion and a non-engraved portion, the engraved portion having a side wall and a bottom face, and (ii) a light blocking film provided in a portion of the bottom face and the side wall of the engraved portion, wherein a value to be defined by subtracting a thickness of the light blocking film at the side wall from a width of the engraved portion is equal to 1.3 to 2.4 times the width of a light transmitting portion provided at the engraved portion.

* * * * *

UNITED STATES PATENT AND TRADEMARK OFFICE
CERTIFICATE OF CORRECTION

PATENT NO. : 6,968,529 B2
DATED : November 22, 2005
INVENTOR(S) : Kenji Yamazoe

It is certified that error appears in the above-identified patent and that said Letters Patent is hereby corrected as shown below:

Column 7,
Line 31, delete "exposurey" and insert -- exposure, --.

Signed and Sealed this

Thirty-first Day of January, 2006

JON W. DUDAS
*Director of the United States Patent and Trademark Office*